United States Patent
Hoffman et al.

(10) Patent No.: US 8,203,144 B2
(45) Date of Patent: *Jun. 19, 2012

(54) SEMICONDUCTOR DEVICE HAVING A METAL OXIDE CHANNEL

(75) Inventors: Randy L. Hoffman, Corvallis, OR (US); Gregory S. Herman, Albany, OR (US); Peter P. Mardilovich, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 50 days.

This patent is subject to a terminal disclaimer.

(21) Appl. No.: 12/779,348

(22) Filed: May 13, 2010

(65) Prior Publication Data
US 2010/0219411 A1  Sep. 2, 2010

Related U.S. Application Data

(63) Continuation of application No. 11/870,618, filed on Oct. 11, 2007, now Pat. No. 7,732,251.

(51) Int. Cl.
*H01L 21/00* (2006.01)
(52) U.S. Cl. ........... 257/43; 257/59; 257/103; 257/347; 257/E21.078
(58) Field of Classification Search ................ 257/103, 257/368, 347, 43, 59, E21.078, E29.068
See application file for complete search history.

(56) References Cited

U.S. PATENT DOCUMENTS
6,727,522 B1 * 4/2004 Kawasaki et al. ............. 257/103

FOREIGN PATENT DOCUMENTS
JP  200422625 A  6/2002

OTHER PUBLICATIONS
Ohta "Frontier of transparent oxide semiconductors", Solid State Electronics, vol. 47, No. 12, Dec. 2003, pp. 2261-2267.*

* cited by examiner

*Primary Examiner* — Thanh Nguyen

(57) ABSTRACT

A semiconductor device includes a metal oxide channel and methods for forming the same. The metal oxide channel includes indium, gallium, and zinc.

8 Claims, 5 Drawing Sheets

SEMICONDUCTOR DEVICE HAVING A METAL OXIDE CHANNEL

CROSS-REFERENCE TO RELATED APPLICATION

This application is a continuation of U.S. application Ser. No. 11/870,618, filed Oct. 11, 2007 now U.S. Pat. No. 7,732,251, which claims priority to U.S. application Ser. No. 10/799,811, filed Mar. 12, 2004, which is U.S. Pat. No. 7,297,977, issued Nov. 20, 2007.

INTRODUCTION

Semiconductor devices are used in a variety of electronic devices. For example, thin-film transistor technology can be used in liquid crystal display (LCD) screens. Some types of thin-film transistors have relatively slow switching speeds because of low carrier mobility. In some applications, such as LCD screens, use of thin-film transistors with relatively slow switching speeds can make it difficult to accurately render motion.

DETAILED DESCRIPTION

Figure 1A:
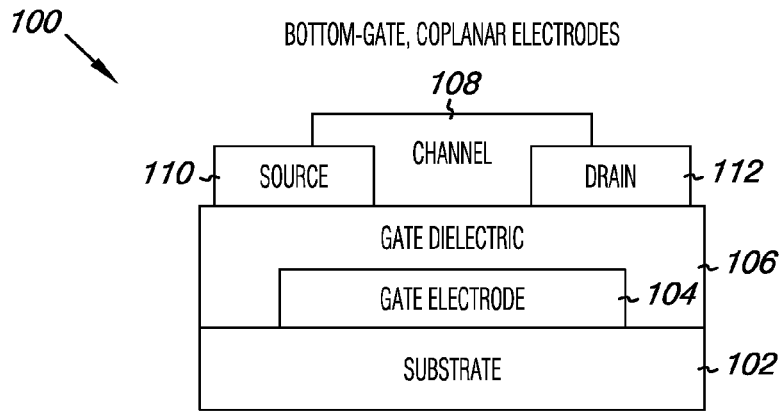
FIGS. 1A-1F illustrate various embodiments of a semiconductor device, such as a thin-film transistor.

The exemplary embodiments of the present disclosure include semiconductor devices, such as transistors, that contain multicomponent oxide semiconductors. Additionally, exemplary embodiments of the present disclosure account for the properties possessed by transistors that contain multicomponent oxide semiconductors, e.g. optical transparency, and electrical performance. Exemplary embodiments include semiconductor devices having multicomponent oxide semiconductor structures that include at least one metal cation from group 12 and at least one metal cation from group 13 to form at least one of a three-component oxide, a four-component oxide, and a two-component oxide that includes zinc-gallium oxide, cadmium-gallium oxide, and cadmium-indium oxide. In some of the exemplary embodiments, the multicomponent oxide semiconductor structure can include an amorphous form, a single-phase crystalline state, or a mixed-phase crystalline state. As used herein, the terms multicomponent oxide, multicomponent oxide, and multicomponent oxide material, are intended to mean oxide material systems that can include two, three, and four-component oxide materials formed from metal cations of group 12 (group IIB of the CAS) and group 13 (group IIIA of the CAS) of the periodic table of the elements.

Unless otherwise indicated, all numbers expressing quantities of ingredients, reaction conditions, and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present disclosure. At the very least, and not as an attempt to limit the application of the doctrine of equivalents to the scope of the claims, each numerical parameter should at least be construed in light of the number of reported significant digits and by applying ordinary rounding techniques.

It should be understood that the various semiconductor devices may be employed in connection with the various embodiments of the present disclosure, i.e., field effect transistors including thin-film transistors, active matrix displays, logic inverters, and amplifiers. FIGS. 1A-1F illustrate various embodiments of a semiconductor device, such as a thin-film transistor. The thin-film transistor can be of any type, including but not limited to, horizontal, vertical, coplanar electrode, staggered electrode, top-gate, bottom-gate, single-gate, and double-gate, to name a few.

As used herein, a coplanar electrode configuration is intended to mean a transistor structure where the source and drain electrodes are positioned on the same side of the channel as the gate electrode. A staggered electrode configuration is intended to mean a transistor structure where the source and drain electrodes are positioned on the opposite side of the channel as the gate electrode.

Figure 1B:
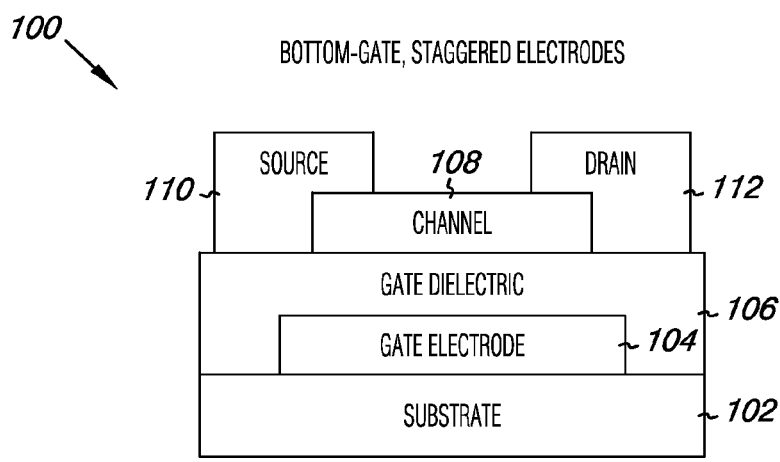
Figure 1C:
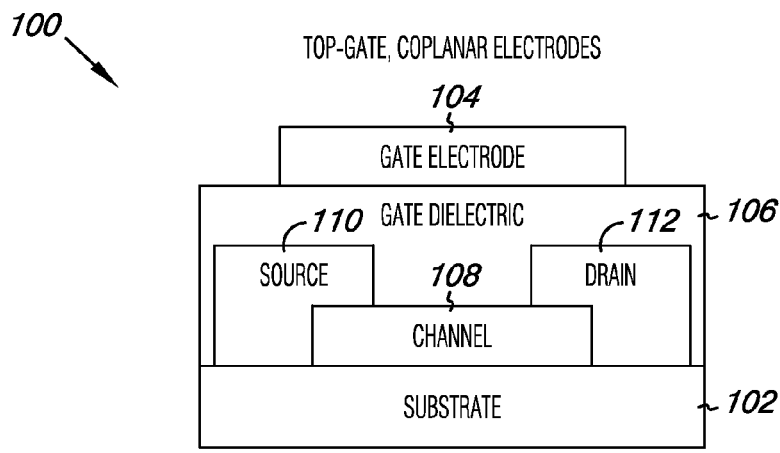
Figure 1D:
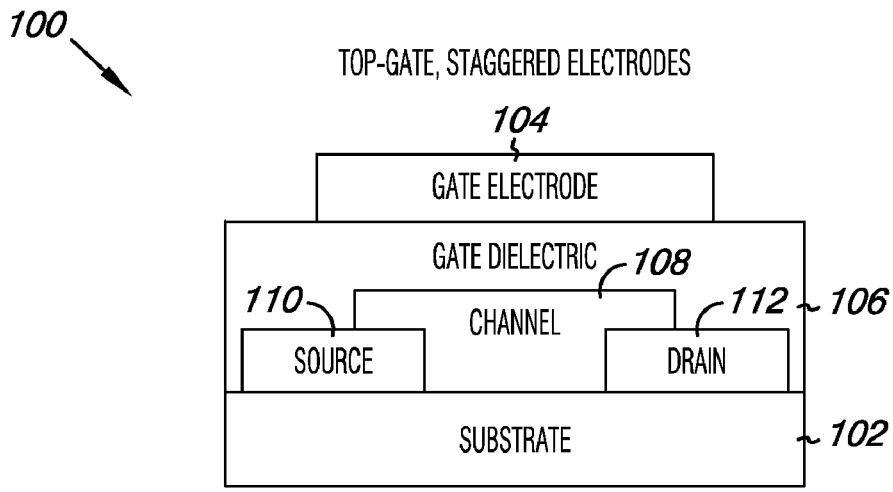
Figure 1E:
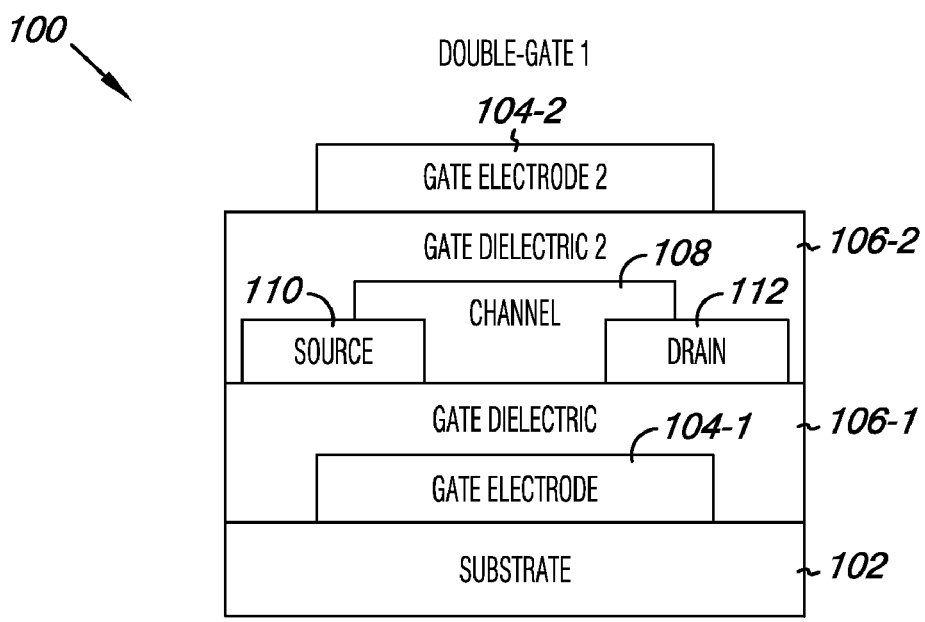
Figure 1F:
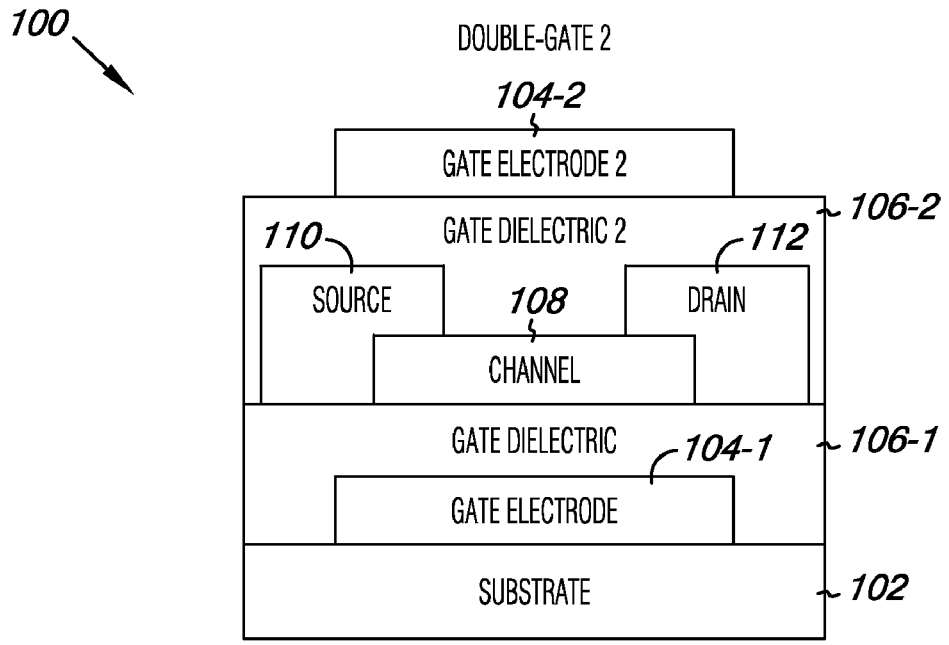

FIGS. 1A and 1B illustrate embodiments of bottom-gate transistors, FIGS. 1C and 1D illustrate embodiments of top-gate transistors, and FIGS. 1E and 1F illustrate embodiments of double-gate transistors. In each of FIGS. 1A-1D, the transistors include a substrate 102, a gate electrode 104, a gate dielectric 106, a channel 108, a source electrode 110, and a drain electrode 112. In each of FIGS. 1A-1D, the gate dielectric 106 is positioned between the gate electrode 104 and the source and drain electrodes 110, 112 such that the gate dielectric 106 physically separates the gate electrode 104 from the source and the drain electrodes 110, 112. Additionally, in each of the FIGS. 1A-1D, the source and the drain electrodes 110, 112 are separately positioned thereby forming a region between the source and drain electrodes 110, 112 for interposing the channel 108. Thus, in each of FIGS. 1A-1D, the gate dielectric 106 is positioned adjacent the channel 108, and physically separates the source and drain electrodes 110,112 from the gate electrode 104. Additionally, in each of the FIGS. 1A-1D, the channel 108 is positioned adjacent the gate dielectric 106 and is interposed between the source and drain electrodes 110, 112.

In various embodiments, such as in the double-gate embodiments shown in FIGS. 1E and 1F, two gate electrodes 104-1, 104-2 and two gate dielectrics 106-1, 106-2 are illustrated. In such embodiments, the positioning of the gate dielectrics 106-1, 106-2 relative to the channel 108 and the source and drain electrodes 110, 112, and the positioning of the gate electrodes 104-1, 104-2 relative to the gate dielectrics 106-1, 106-2 follow the same positioning convention described above where one gate dielectric and one gate electrode are illustrated. That is, the gate dielectrics 106-1, 106-2 are positioned between the gate electrodes 104-1, 104-2 and the source and drain electrodes 110, 112 such that the gate dielectrics 106-1, 106-2 physically separate the gate electrodes 104-1, 104-2 from the source and the drain electrodes 110, 112.

In each of FIGS. 1A-1F, the channel 108 interposed between the source and the drain electrodes 110, 112 provide a controllable electric pathway between the source and drain electrodes 110, 112 such that when a voltage is applied to the gate electrode 104, an electrical charge can move between the source and drain electrodes 110, 112 via the channel 108. The voltage applied at the gate electrode 104 can vary the ability of the channel 108 to conduct the electrical charge and thus, the electrical properties of the channel 108 can be controlled, at least in part, through the application of a voltage at the gate electrode 104.

Figure 2:
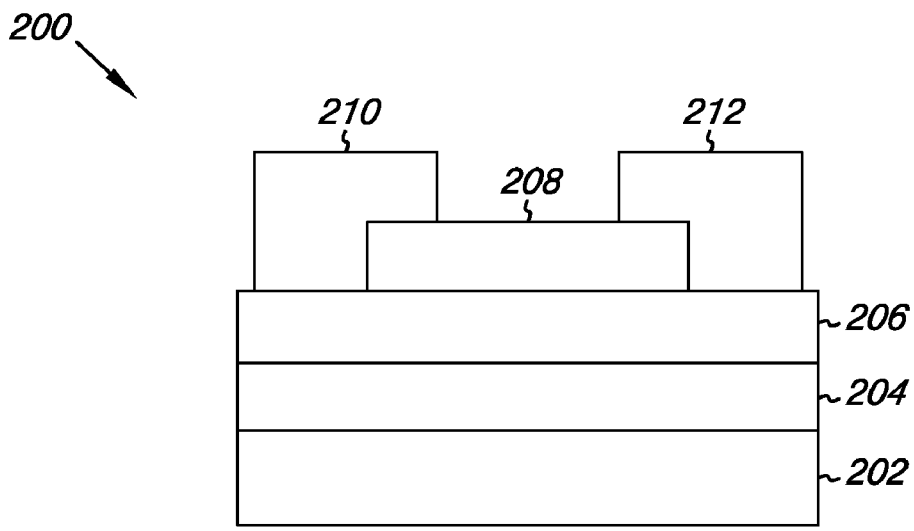
FIG. 2 illustrates a cross-sectional schematic of an embodiment of a thin-film transistor.

A more detailed description of an embodiment of a semiconductor device such as a thin-film transistor is illustrated in FIG. 2. FIG. 2 illustrates a cross-sectional view of an exemplary bottom gate thin-film transistor 200. It will be appreciated that the different layers of the thin-film transistor described in FIG. 2, the materials in which they constitute, and the methods in which they are formed can be equally applicable to any of the transistor embodiments described herein, including those described in connection with FIGS. 1A-1F. Moreover, in the various embodiments, the thin-film transistor 200 can be included in a number of devices including an active matrix display screen device, a logic inverter, and an amplifier. The thin-film transistor 200 can also be included in an infrared device, where transparent components are also used.

As shown in FIG. 2, the thin-film transistor 200 can include a substrate 202, a gate electrode 204 positioned adjacent the substrate 202, a gate dielectric 206 positioned adjacent the gate electrode 204, and a channel 208 positioned between the gate dielectric 206, a source electrode 210, and a drain electrode 212. In the embodiment shown in FIG. 2, the substrate 202 includes glass. However, substrate 202 can include any suitable substrate material or composition for implementing the various embodiments.

The substrate 202 illustrated in FIG. 2 includes a blanket coating of ITO, i.e., indium-tin oxide to form the gate electrode 204 layer. However, any number of materials can be used for the gate electrode 204. Such materials can include transparent materials such as an n-type doped $In_2O_3$, $SnO_2$, or ZnO, and the like. Other suitable materials include metals such as In, Sn, Ga, Zn, Al, Ti, Ag, Cu, and the like. In the embodiment illustrated in FIG. 2, the thickness of the gate electrode 204 is approximately 200 nm. The thickness of a gate electrode layer can vary depending on the materials used, device type, and other factors.

The gate dielectric 206 shown in FIG. 2 is also blanket coated. Although the gate electrode 204 and gate dielectric 206 are shown as blanket coated, unpatterned layers in FIG. 2, they can be patterned. In the various embodiments, the gate dielectric layer 206 can include various layers of different materials having insulating properties representative of gate dielectrics. Such materials can include tantalum pentoxide ($Ta_2O_5$), Strontium Titanate (ST), Barium Strontium Titanate (BST), Lead Zirconium Titanate (PZT), Strontium Bismuth Tantalate (SBT) and Bismuth Zirconium Titanate (BZT), silicon dioxide ($SiO_2$), silicon nitride ($Si_3N_4$), magnesium oxide (MgO), aluminum oxide ($Al_2O_3$), hafnium(IV)oxide ($HfO_2$), zirconium(IV)oxide ($ZrO_2$), various organic dielectric material, and the like.

In various embodiments, the gate dielectric 206 may be deposited by a low-pressure CVD process using $Ta(OC_2H_5)_5$ and $O_2$ at about 430° C., and may be subsequently annealed in order to reduce leakage current characteristics. Other methods for introducing the gate dielectric layer can include various CVD and sputtering techniques and atomic layer deposition, evaporation, and the like as will be described in more detail herein.

In the various embodiments, the source electrode 210 and the drain electrode 212 are separately positioned adjacent the gate dielectric 206. In the embodiment shown in FIG. 2, the source and drain electrodes 210, 212 can be formed from the same materials as those discussed in regards to the gate electrode 204. In FIG. 2, the source and drain electrodes 210, 212 have a thickness of approximately 200 nm. However, the thickness can vary depending on composition of material used, application in which the material will be used, and other factors. The choice of source and drain electrode material can vary depending on the application, device, system, etc., in which they will be used. Overall device performance is likely to vary depending on the source and drain materials. For example, in devices where a substantially transparent thin-film transistor is desired, the materials for the source, drain, and gate electrodes can be chosen for that effect.

In the various embodiments, the channel 208 can be formed from a multicomponent oxide material that includes two, three, and four-component oxides that include metal cations from group 12 and group 13 of the periodic table of elements. As used herein, a multicomponent oxide is intended to mean a two, three, and four-component oxide that can include various metal cations of groups 12 and 13, as disclosed herein. Additionally, in the various embodiments including two, three, and four component oxides, each component is different. Thus, a two-component oxide can include two different metal cations, and a four-component oxide can include four different metal cations.

In the various embodiments, the channel can be described as including one or more compounds of a formula, as described herein. In the various embodiments, the formula can be characterized by a series of letters that include A, B, C, D (representing cations as described herein), and O (atomic oxygen). The formula can also be characterized by a subscript x of the series of letters, e.g. $A_x$. In the formula, the letters, other than O, are intended to denote the identity of a metal cation selected from a defined group, and the subscripts are intended to denote the identity of the metal cation selected from the defined group. For example, if A represents the metal cation Zn, and x represents the number 2, then $A_x$ can include $Zn_2$, e.g., two atoms of Zn.

Additionally, the letter O denotes atomic oxygen as characterized by the symbol O on the periodic table of the elements. Thus, depending on the stoichiometry of a compound derived from a formula, the subscript of O, i.e., $O_x$, in the formula can vary depending on the number of atoms of metal cations included in any given formula. For example, the formula $A_xB_xO_x$ can include the binary metal oxide: zinc-gallium oxide having the stoichiometric arrangement: $Zn_2Ga_2O_5$, wherein $O_5$ denotes the number of oxygen atoms associated with this combination of ZnO and $Ga_2O_3$.

In the formulas described herein, at least one metal cation from each of groups 12 and 13 are included in the multicomponent oxide material. For example, the formula $A_xB_xC_xO_x$ can include a variety of three-component oxides formed from the selection of at least one group 12 and at least one group 13 metal cation. Thus, in a multicomponent oxide having two, three, or four components, at least one metal cation from each of groups 12 and 13 are included. Additionally, a selected metal cation in any given formula is selected one time. That is, in the formula, $A_xB_xC_xO_x$, if A is selected to be zinc, then neither B nor C can include zinc.

In various embodiments, the channel 208 can be formed from a multicomponent oxide material that includes one of a ternary metal oxide including: zinc-gallium oxide, cadmium-gallium oxide, and cadmium-indium oxide. In these embodiments, the metal oxide can include an atomic composition of metal(A)-to-metal(B) ratio (A:B), where A and B can independently take values from about 0.05 to about 0.95. Thus, a zinc-gallium oxide can include an atomic composition having a relative concentration of 0.05 zinc and 0.95 gallium or 0.95 zinc and 0.05 gallium. That is, the channel according to this embodiment can include various two-component oxides having an atomic composition of each component falling within the range of about 0.05 to about 0.95.

In various embodiments, the channel 208 can be formed from a multicomponent oxide material that includes one or more compounds of the formula $A_xB_xC_xO_x$. In such embodiments, each A can be selected from the group of Zn, Cd, each B can be selected from the group of Ga, In, each C can be selected from the group of Zn, Cd, Ga, In, each O can be atomic oxygen, each x can be independently a non-zero integer, and each of A, B, and C are different. That is, the value of "x" for each of the constituent elements may be different and in the embodiment of formula $A_xB_xC_xO_x$, if B is zinc, then A or C will not include zinc. In these embodiments, according to the formula $A_xB_xC_xO_x$, four three-component oxides can be formed. The four three-component oxides can include: zinc-gallium-indium oxide, cadmium-gallium-indium oxide, zinc-cadmium-gallium oxide, and zinc-cadmium-indium oxide. Further, in these embodiments, the one or more compounds of the formula $A_xB_xC_xO_x$ can include an atomic composition of ratio A:B:C, wherein A, B, and C, are each in a range of about 0.025 to about 0.95. Thus, for example, a zinc-gallium-indium oxide can include a concentration having a ratio, near ends of a range, of about 0.025 zinc, 0.025 gallium, and 0.95 indium or about 0.95 zinc, 0.025 gallium, and 0.025 indium or about 0.025 zinc, 0.95 gallium, and 0.025 indium or ratios of zinc/gallium/indium in between the ratio near ends of the range. That is, the channel according to this embodiment can include various three-component oxides having atomic composition ratios with the relative concentration of each component falling within the range of about 0.025 to about 0.95.

In one embodiment, the channel 208 can be formed from a multicomponent oxide material that includes one or more compounds of the formula $A_xB_xC_xD_xO_x$. In this embodiment, each A can be selected from the group of Zn, Cd, each B can be selected from the group of Ga, In, each C can be selected from the group of Zn, Cd, Ga, In, each D can be selected from the group of Zn, Cd, Ga, In, each O can be atomic oxygen, and each x can be independently a non-zero integer. That is, the value of "x" for each of the constituent elements may be different. Thus, in this embodiment, a four-component oxide can be formed that includes a zinc-cadmium-gallium-indium oxide. In this embodiment, the one or more compounds of the formula $A_xB_xC_xD_xO_x$ can include an atomic composition of ratio A:B:C:D wherein A, B, C, and D, are each in a range of about 0.017 to about 0.95. Thus, the zinc-cadmium-gallium-indium oxide can include an atomic composition having a ratio, near ends of a range, of about 0.017 zinc, 0.017 cadmium, 0.017 gallium, and 0.95 indium or ratios of zinc/cadmium/gallium/indium in between the ratio near ends of the range. That is, the channel according to this embodiment can include a four-component oxide having atomic composition ratios with the relative concentration of each component falling within the range of about 0.017 to about 0.95.

As one of ordinary skill will understand, the atomic composition ratios of metal cations for any given two, three, and four component oxides are not limited to the ratios in the foregoing embodiments. In various embodiments, each of the two, three, and four component oxides can be formed having a variety of atomic composition ratios. For example, a three-component oxide can include an atomic composition having a ratio of 0.025 zinc, 0.485 gallium, and 0.49 indium.

In the various embodiments, the multicomponent oxide can include various morphologies depending on composition, processing conditions, and other factors. The various morphological states can include amorphous states, and polycrystalline states. A polycrystalline state can include a single-phase crystalline state or a mixed-phase crystalline state. Additionally, in the various embodiments, the source, drain, and gate electrodes can include a substantially transparent material. By using substantially transparent materials for the source, drain, and gate electrodes, areas of the thin-film transistor can be transparent to the portion of the electromagnetic spectrum that is visible to the human eye. In the transistor arts, a person of ordinary skill will appreciate that devices such as active matrix liquid crystal displays having display elements (pixels) coupled to thin-film transistors (TFT's) having substantially transparent materials for selecting or addressing the pixel to be on or off will improve display performance by allowing more light to be transmitted through the display.

Referring back to FIG. 2, the channel 208 can be formed from a multicomponent oxide with a channel thickness of about 50 nm, however, in various embodiments the thickness of the channel can vary depending on a variety of factors including whether the channel material is amorphous or polycrystalline, and the device in which the channel is to be incorporated.

In this embodiment, the channel 208 is positioned adjacent the gate dielectric 206 and between the source and drain electrodes 210, 212. An applied voltage at the gate electrode 204 can facilitate electron accumulation or depletion in the channel 208. In addition, the applied voltage can enhance electron injection from the source electrode 210 to the channel 208 and electron extraction therefrom by the drain electrode 212. In the embodiments of the present disclosure, the channel 208 can allow for on/off operation by controlling current flowing between the drain electrode 212 and the source electrode 210 using a voltage applied to the gate electrode 204.

In various embodiments, the channel 208 can include a multicomponent oxide material with at least one metal cation selected from group 12, and at least one metal cation selected from group 13, wherein group 12 metal cations can include Zn and Cd, and group 13 metal cations can include Ga and In, to form at least one of a three-component oxide, a four-component oxide, and a two-component oxide that includes zinc-gallium oxide, cadmium-gallium oxide, cadmium-indium oxide. Additionally, in the various embodiments, each component in the multicomponent oxide material is different. For example, where a multicomponent oxide includes three metal cations, i.e., a three-component oxide, the same two cations will not be included in the three-component oxide, thus, if zinc is included in the three-component oxide, it will not be included as a second or third component of the three-component oxide. In another example, if zinc is a component of a four-component oxide, the other three components of the four-component oxide will not include zinc. These atomic compositions do not take into consideration the optional presence of oxygen and other elements. They are merely a representation of the selection of cations for the multicomponent oxide material used for the channel of a thin-film transistor.

The multicomponent oxides, as described herein, can provide very satisfactory electrical performance, specifically in the area of channel mobility. As appreciated by one skilled in the art, mobility is a characteristic that can help in determining thin-film transistor performance, as maximum operating frequency, speed, and drive current increase in direct proportion to channel mobility. In addition, the channel can be transparent in both the visible and near-infrared spectrums, allowing for an entire thin-film transistor to be optically transparent throughout the visible region of the electromagnetic spectrum.

The use of the multicomponent oxide channel illustrated in the embodiments of the present disclosure is beneficial for a wide variety of thin-film applications in integrated circuit structures. For example, such applications include transistors, as discussed herein, such as thin-film transistors, horizontal, vertical, coplanar electrode, staggered electrode, top-gate, bottom-gate, single-gate, and double-gate, to name only a few. In the various embodiments, transistors (e.g., thin-film transistors) of the present disclosure can be provided as switches or amplifiers, where applied voltages to the gate electrodes of the transistors can affect a flow of electrons through the channel. As one of ordinary skill will appreciate, transistors can operate in a variety of ways. For example, when a transistor is used as a switch, the transistor can operate in the saturation region, and where a transistor is used as an amplifier, the transistor can operate in the linear region. In addition, the use of transistors incorporating channels of a multicomponent oxide in integrated circuits and structures incorporating integrated circuits such as visual display panels (e.g., active matrix LCD displays) such as that shown and described in connection with FIG. 4 below. In display applications and other applications, it will often be desirable to fabricate one or more of the remaining thin-film transistor layers, e.g., source, drain, and gate electrodes, to be at least partially transparent.

In FIG. 2, the source electrode 210 and the drain electrode 212 include an ITO layer having a thickness of about 200 nm. In the various embodiments however, the thickness can vary depending on a variety of factors including type of materials, applications, and other factors. In various embodiments, the source and drain electrodes 210, 212, may include a transparent conductor, such as an n-type doped wide-bandgap semiconductor. Examples include, but are not limited to, n-type doped $In_2O_3$, $SnO_2$, indium-tin oxide (ITO), or ZnO, and the like. The source and drain electrodes 210, 212 may also include a metal such as In, Sn, Ga, Zn, Al, Ti, Ag, Cu, Au, Pt, W, or Ni, and the like. In the various embodiments of the present disclosure, all of the electrodes 204, 210, and 212 may include transparent materials such that the various embodiments of the transistors may be made substantially transparent.

The various layers of the transistor structures described herein can be formed using a variety of techniques. For example, the gate dielectric 206 may be deposited by a low-pressure CVD process using $Ta(OC_2H_5)_5$ and $O_2$ at about 430° C., and may be subsequently annealed in order to reduce leakage current characteristics. Thin-film deposition techniques such as evaporation (e.g., thermal, e-beam), physical vapor deposition (PVD) (e.g., do reactive sputtering, rf magnetron sputtering, and ion beam sputtering), chemical vapor deposition (CVD), atomic layer deposition (ALD), pulsed laser deposition (PLO), molecular beam epitaxy (MBE), and the like may be employed. Additionally, alternate methods may also be employed for depositing the various transistor layers of the embodiments of the present disclosure. Such alternate methods can include anodization (electrochemical oxidation) of a metal film, as well as deposition from a liquid precursor such as spin coating and ink-jet printing including thermal and piezoelectric drop-on-demand printing. Film patterning may employ photolithography combined with etching or lift-off processes, or may use alternate techniques such as shadow masking. Doping of one or more of the layers (e.g., the channel illustrated in FIG. 2) may also be accomplished by the introduction of oxygen vacancies and/or substitution of aliovalent elements.

Embodiments of the present disclosure also include methods of forming metal containing films on a surface of a substrate or substrate assembly, such as a silicon wafer, with or without layers or structures formed thereon, used in forming integrated circuits, and in particular thin-film transistors as described herein. It is to be understood that methods of the present disclosure are not limited to deposition on silicon wafers; rather, other types of wafers (e.g., gallium arsenide, glass, etc.) can be used as well.

Furthermore, other substrates can also be used in methods of the present disclosure. These include, for example, fibers, wires, etc. In general, the films can be formed directly on the lowest surface of the substrate, or they can be formed on any of a variety of the layers (i.e., surfaces) as in a patterned wafer, for example.

Figure 3:
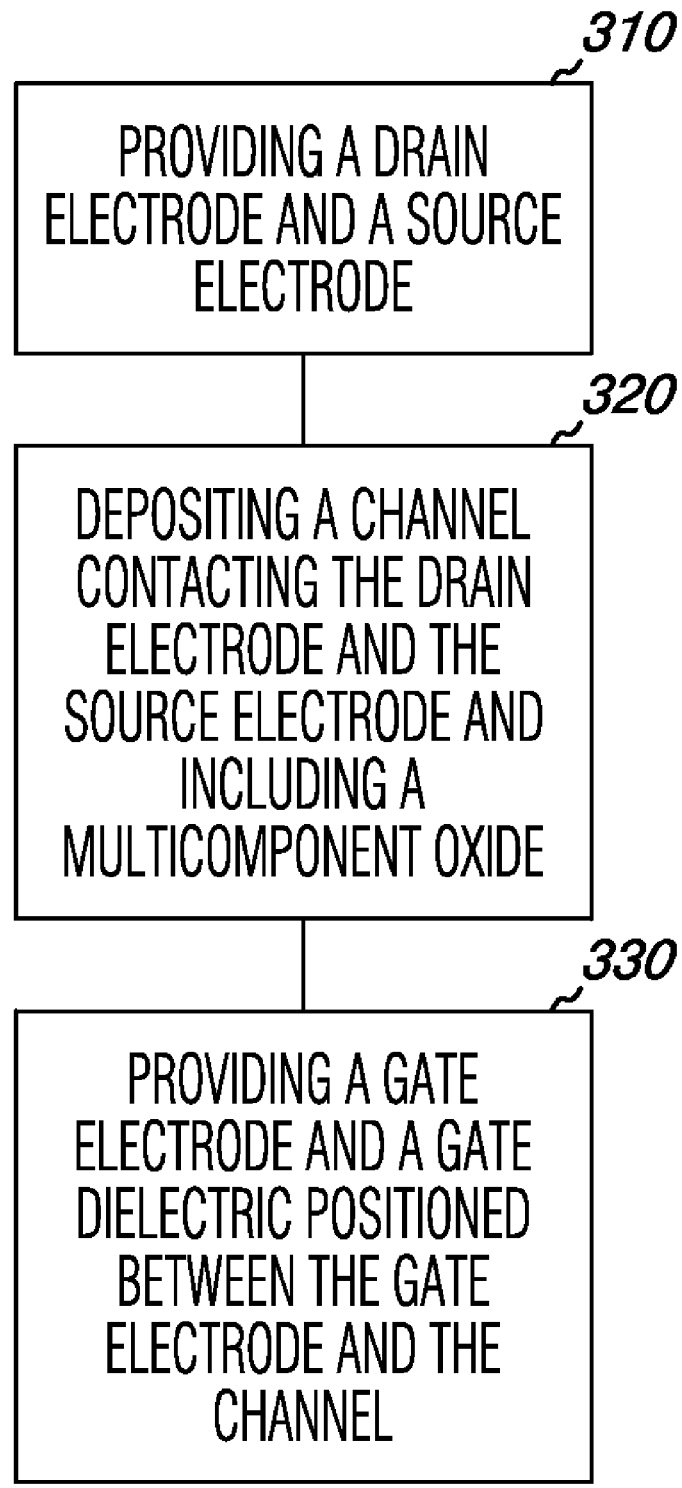
FIG. 3 illustrates a method embodiment for manufacturing an embodiment of a thin-film transistor.

In FIG. 3, a method for fabricating a semiconductor device is illustrated. In the various embodiments of the present disclosure, a substrate or substrate assembly can be provided in forming the semiconductor structure. As used herein, the term "substrate" refers to the base substrate material layer, e.g., the lowest layer of glass material in a glass wafer. The term "substrate assembly" refers to the substrate having one or more layers or structures formed thereon. Examples of substrate types include, but are not limited to, glass, plastic, and metal, and include such physical forms as sheets, films, and coatings, among others, and may be opaque or substantially transparent.

In block 310, a drain electrode and a source electrode can both be provided. For example, both the drain electrode and the source electrode can be provided on the substrate of substrate assembly.

In the various embodiments, precursor compounds are described as metals, oxides of metals, multicomponent oxides, and formulas having letters and subscripts. In formulas, the letters, e.g., A, are intended to denote a metal cation selected from a defined group and the subscripts, e.g., x, are intended to denote the number of atoms of the metal cation selected from the defined group. Additionally, a compound as used herein can include two or more elements including metal cations from groups 12 and 13, and oxygen. The precursor compounds described herein do not indicate the presence of $O_x$; however, as one of ordinary skill will understand the precursor compounds can also include oxygen to provide the oxide of the compound. In other words, many of the precursor compounds listed below are provided as multicomponent metals, i.e., metal-metal compounds. The below described method is not intended to limit the compounds by excluding oxygen. As one of ordinary skill will understand, oxygen can be included in the precursor compounds in the various deposition techniques described herein.

Various combinations of the precursor compounds described herein can be used in a precursor composition. Thus, as used herein, a "precursor composition" refers to a solid or liquid that includes one or more precursor compounds described herein optionally mixed with one or more precursor compounds other than those described herein. For example, zinc precursor compounds and gallium precursor compounds can be provided in one precursor composition or in separate compositions. Where they are included in separate compositions, both precursor compositions are included when a channel is deposited.

In block 320, a channel contacting the drain electrode and the source electrode, and including a multicomponent oxide, can be deposited.

For example, the channel can be deposited between the drain electrode and a source electrode so as to electrically couple the two electrodes. In the various embodiments, depositing the channel contacting the drain electrode and the source electrode can include providing at least one precursor composition including one or more precursor compounds that include: zinc-gallium oxide, cadmium-gallium oxide, and cadmium-indium oxide can be provided. For example, zinc precursor compounds and cadmium precursor compounds can be provided in one precursor composition or in separate compositions. Thus, a precursor composition according to these embodiments can include binary metal oxides, i.e., zinc oxide, and other multicomponent metal oxides, i.e., zinc-gallium oxide. Where a precursor composition includes a binary metal oxide, an additional precursor composition including a different binary metal oxide can be included when depositing a channel, thereby forming a channel that includes a multicomponent metal oxide, such as a zinc-gallium oxide.

Additionally, in various embodiments, the precursor composition can further include one or more precursor compounds that include $A_x$, one or more precursor compounds that include $B_x$, and one or more precursor compounds that include $C_x$.

In such embodiments, each A can be selected from the group of Zn, Cd, each B can be selected from the group of Ga, In, each C can be selected from the group of Zn, Cd, Ga, In, each x can be independently a non-zero integer, and each of A, B, and C are different. That is, the value of "x" for each of the constituent elements may be different. Thus, in these embodiments, at least one metal cation from a group defined by A, at least one metal cation from a group defined by B, and at least one metal cation from a group defined by C can be provided to form one or more precursor compositions of one or more compounds of $A_x$, $B_x$, and $C_x$. For example, a precursor composition according to these embodiments can include precursor compounds of Ax, Bx, and Cx. Additionally, a precursor compound according to these embodiments can include compounds of Ax and Cx. In such a case, an additional precursor composition including Bx can be included when depositing a channel, thereby forming a channel that includes a quaternary metal oxide, i.e., a three-component oxide.

In one embodiment, the precursor composition can further include one or more precursor compounds that include D. In this embodiment, each A, B, and C can include those materials as described herein, and each D can be selected from the group of Zn, Cd, Ga, In, each x can be independently a non-zero integer, and each of A, B, C, and D are different. That is, the value of "x" for each of the constituent elements may be different. Thus, in this embodiment, the precursor composition can include one or more compounds that include $A_x$, $B_x$, $C_x$, and $D_x$. In such an embodiment, at least one metal cation from groups defined by A, B, C, and D can be provided to form one or more precursor compositions of one or more compounds of $A_x$, $B_x$, $C_x$, and $D_x$. In this embodiment however, a deposited channel includes the precursor compounds of $A_x$, $B_x$, $C_x$, and $D_x$, thereby forming a channel that includes a four-component oxide.

As used herein, "liquid" refers to a solution or a neat liquid (a liquid at room temperature or a solid at room temperature that melts at an elevated temperature). As used herein, a "solution" does not call for complete solubility of the solid; rather, the solution may have some undissolved material, more desireably, however, there is a sufficient amount of the material that can be carried by the organic solvent into the vapor phase for chemical vapor deposition processing. The precursor compounds as used herein can also include one or more organic solvents suitable for use in a chemical vapor deposition system, as well as other additives, such as free ligands, that assist in the vaporization of the desired precursor compounds.

A wide variety of Zn, Cd, Ga, and In precursor compounds suitable for thin-film deposition techniques can be used with the embodiments of the present disclosure. Examples of the precursor compounds include, but are not limited to, the metals and oxides of the metals, including ZnO, $ZnO_2$, CdO, GaO, $Ga_2O$, $Ga_2O_3$, InO, and $In_2O_3$ precursor compounds. Although specific precursor compounds are illustrated herein, a wide variety of precursor compounds can be used as long as they can be used in a deposition process. In the various embodiments of the present disclosure, the Zn, Cd, Ga, and In precursor compounds can include neutral precursor compounds and may be liquids or solids at room temperature. If they are solids, they are sufficiently soluble in an organic solvent to allow for vaporization, they can be vaporized or sublimed, or ablated (e.g., by laser ablation or sputtering) from the solid state, or they have melting temperatures below their decomposition temperatures. Thus, many of the precursor compounds described herein are suitable for use in vapor deposition techniques, such as chemical vapor deposition (CVD) techniques, (e.g., flash vaporization techniques, bubbler techniques, and/or microdroplet techniques).

The precursor compounds described herein can be used in precursor compositions for ink-jet deposition, sputtering, and vapor deposition techniques (e.g., chemical vapor deposition (CVD) or atomic layer deposition (ALD)). Alternatively, certain precursor compounds described herein can be used in precursor compositions for other deposition techniques, such as spin-on coating, and the like. Typically, those precursor compounds containing organic R groups with a low number of carbon atoms (e.g., 1-4 carbon atoms per R group) are suitable for use with vapor deposition techniques. Those precursor compounds containing organic R groups with a higher number of carbon atoms (e.g., 5-12 carbon atoms per R group) are generally suitable for spin-on or dip coating.

As used herein, the term "organic R groups" means a hydrocarbon group (with optional elements other than carbon and hydrogen, such as oxygen, nitrogen, sulfur, and silicon) that is classified as an aliphatic group, cyclic group, or combination of aliphatic and cyclic groups (e.g., alkaryl and aralkyl groups). In the context of the present disclosure, the organic groups are those that do not interfere with the formation of a metal-containing film. They may be of a type and size that do not interfere with the formation of a metal-containing film using chemical vapor deposition techniques. The term "aliphatic group" means a saturated or unsaturated linear or branched hydrocarbon group. This term is used to encompass alkyl, alkenyl, and alkynyl groups, for example. The term "alkyl group" means a saturated linear or branched hydrocarbon group including, for example, methyl, ethyl, isopropyl, t-butyl, heptyl, dodecyl, octadecyl, amyl, 2-ethylhexyl, and the like. The term "alkenyl group" means an unsaturated, linear or branched hydrocarbon group with one or more carbon-carbon double bonds, such as a vinyl group. The term "alkynyl group" means an unsaturated, linear or branched hydrocarbon group with one or more carbon-carbon triple bonds. The term "cyclic group" means a closed ring hydrocarbon group that is classified as an alicyclic group, aromatic group, or heterocyclic group. The term "alicyclic group" means a cyclic hydrocarbon group having properties resembling those of aliphatic groups. The term "aromatic group" or "aryl group" means a mono- or polynuclear aromatic hydrocarbon group. The term "heterocyclic group" means a closed ring hydrocarbon in which one or more of the atoms in the ring is an element other than carbon (e.g., nitrogen, oxygen, sulfur, etc.).

Still referring to FIG. 3, the channel can be deposited including the precursor composition to form a multicomponent oxide from the precursor composition to electrically couple a drain electrode and a source electrode. In various embodiments, the channel can employ various physical vapor deposition techniques, such as dc reactive sputtering, rf sputtering, magnetron sputtering, and ion beam sputtering. Other methods for depositing the channel can include using an ink-jet deposition technique when the precursor composition includes a liquid form.

In the various embodiments, the multicomponent oxide included in the channel can have a uniform composition throughout its thickness, although this is not a requisite. For example, in a four-component oxide, a precursor composition including a precursor compound that includes $A_x$ can be deposited first and then a combination of precursor compounds that include $B_x$, $C_x$, and $D_x$ can be deposited to form a four-component oxide channel. As will be appreciated, the thickness of the multicomponent oxide channel will be dependent upon the application for which it is used. For example, the thickness can have a range of about 1 nanometer to about 1,000 nanometers. In an alternative embodiment, the thickness can have a range of about 10 nanometers to about 200 nanometers.

In the embodiments of the present disclosure, the multicomponent oxide can include compounds of at least one metal cation from group 12, and at least one metal cation from group 13, wherein the group 12 cation includes Zn and Cd cations, and the group 13 cation includes Ga and In cations to form at least one of a three-component oxide, a four-component oxide, and a two-component oxide that includes zinc-gallium oxide, cadmium-gallium oxide, cadmium-indium oxide. The precursor compounds for group 12 and group 13 metal cations are typically mononuclear (i.e., monomers in that they contain one metal per molecule), although weakly bound dimers (i.e., dimers containing two monomers weakly bonded together through hydrogen or dative bonds) are also possible. In additional embodiments of the present disclosure, the precursor compounds used for forming the multicomponent oxide can include organometallic compounds suitable for vapor deposition. Example of such organometallic compounds include, but are not limited to, zinc acethylacetonate $[Zn(C_5H_7O_2)_2]$ and indium acethylacetonate $[In(C_5H_7O_2)_3]$.

As discussed herein, the precursor compounds used for forming the multicomponent oxide in a sputtering process in the embodiments of the present disclosure can include two, three, and four-component oxides. For example, a two-component oxide can be used as a target to form the channel. The two-component oxide can be deposited in a thin-film by sputtering by use of the above-mentioned target and a single-phase crystalline state for the channel can be obtained. For illustration, a single-phase crystalline state can include compounds from group 12, and compounds from group 13, wherein group 12 includes an oxide of the metal cation Zn, such as ZnO, and group 13 includes an oxide of the metal cation Ga, such as $Ga_2O_3$, of the formula:

$$Zn_xGa_{2y}O_{x+3y}$$

In this embodiment, the values of x and y can be found in given ranges. For example, x and y can each independently be found in a range of about 1 to about 15, a range of about 2 to about 10, integer values greater than 1, and integer values less than 15. Specific examples of the value of x and y include 2 and 1, respectively, where the single-phase crystalline state of the zinc-gallium oxide includes $Zn_2Ga_2O_5$.

Alternatively, embodiments of the zinc-gallium oxide can exhibit a mixed-phase crystalline state resulting from sputtering by use of the above-mentioned target. For example, the mixed-phase crystalline state can include, but is not limited to, two or more phases that can include, for example, ZnO, $Zn_2Ga_2O_5$, and $Ga_2O_3$ with a range of phase-to-phase ratio A:B:C (e.g., ZnO:$Zn_2Ga_2O_5$: $Ga_2O_3$), where A, B, and C, are each in the range of about 0.01 to about 0.99.

Additionally, the compounds of the group 12 and group 13 cations can exhibit excellent electron transport in the amorphous state. As such, a desireable level of performance can be achieved without crystallization of the multicomponent oxide. Thus, in various embodiments, the zinc-gallium oxide can have a substantially amorphous form. For example, the zinc-gallium oxide can include an atomic composition of zinc(x):gallium (1-x), where x is in the range of about 0.01 to about 0.99. This atomic composition does not take into consideration the optional presence of oxygen and other elements. It is merely a representation of the relative ratio of zinc and gallium. In an additional embodiment, x can be in the range of about 0.1 to about 0.9, and in the range of about 0.05 to about 0.95.

As one of ordinary skill will appreciate, in embodiments where three and four-component oxides are used for channel formation by sputtering and other deposition techniques, the atomic compositions for each precursor compound can include a range of about 0.01 to about 0.99. Additionally, other ranges can include a range of about 0.1 to about 0.9, and a range of about 0.05 to about 0.095.

Additionally, since each of these multicomponent oxide materials is based on combination of groups 12 and 13 cations, a substantial degree of qualitative similarity is expected in structural and electrical properties, and in processing considerations. Furthermore, zinc-indium oxide, a constituent of the two-component oxides disclosed herein has been shown to exhibit excellent electron transport and thus, qualitatively similar performance from the remaining two-component oxide combinations including the three, and four-component oxides can be expected. An example of the electron transport characteristics of the zinc-indium oxide can be found in commonly assigned U.S. Pat. No. 7,145,174 entitled "SEMICONDUCTOR DEVICE", having common inventorship, filed on Mar. 12, 2004, issued Dec. 5, 2006.

Sputtering or chemical vapor deposition processes can be carried out in an atmosphere of inert gas and/or a reaction gas to form a relatively pure multicomponent oxide channel. The inert gas is typically selected from the group including nitrogen, helium, argon, and mixtures thereof. In the context of the present disclosure, the inert gas is one that is generally unreactive with the precursor compounds described herein and does not interfere with the formation of a multicomponent oxide channel.

The reaction gas can be selected from a wide variety of gases reactive with the precursor compounds described herein, at least at a surface under the conditions of deposition. Examples of reaction gases include hydrogen and oxidizing gases such as $O_2$. Various combinations of carrier gases and/or reaction gases can be used in the embodiments of the present disclosure to form the multicomponent oxide channel.

For example, in a sputtering process for the multicomponent oxide channel, the process may be performed by using a mixture of argon and oxygen as the sputtering gas at a particular flow rate, with the application of an RF power for achieving the desired deposition in a sputter deposition chamber. However, it should be readily apparent that any manner of forming the multicomponent oxide channel is contemplated in accordance with the present disclosure and is in no manner limited to any particular process, e.g., sputtering, for formation thereof.

In block 330, both a gate electrode and a gate dielectric positioned between the gate electrode and the channel can be provided in forming an embodiment of the thin-film transistor of the present disclosure.

Figure 4:
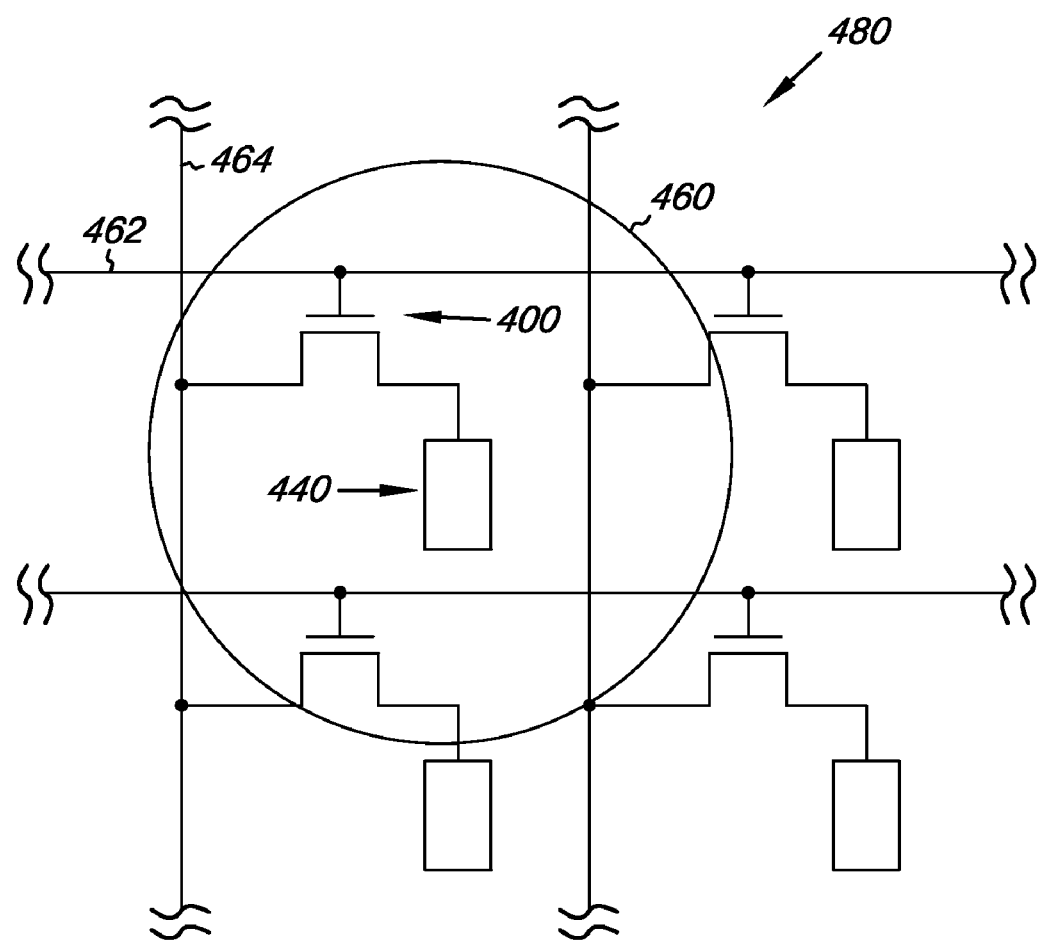
FIG. 4 illustrates an embodiment of an active matrix display area.

The embodiments described herein may be used for fabricating chips, integrated circuits, monolithic devices, semiconductor devices, and microelectronic devices, such as display devices. For example, FIG. 4 illustrates an embodiment of a display device such as an active-matrix liquid-crystal display (AMLCD) 480. In FIG. 4, the AMLCD 480 can include pixel devices (i.e., liquid crystal elements) 440 in a matrix of a display area 460. The pixel devices 440 in the matrix can be coupled to thin-film transistors 400 also located in the display area 460. The thin-film transistor 400 can include embodiments of the thin-film transistors as disclosed herein. Additionally, the AMLCD 480 can include orthogonal control lines 462 and 464 for supplying an addressable signal voltage to the thin-film transistors 400 to influence the thin-film transistors to turn on and off and control the pixel devices 440, e.g., to provide an image on the AMLCD 480.

Although specific exemplary embodiments have been illustrated and described herein, those of ordinary skill in the art will appreciate that an arrangement calculated to achieve the same techniques can be substituted for the specific exemplary embodiments shown. This disclosure is intended to cover adaptations or variations of the embodiments of the disclosure. It is to be understood that the above description has been made in an illustrative fashion, and not a restrictive one.

Combination of the above exemplary embodiments, and other embodiments not specifically described herein will be apparent to those of skill in the art upon reviewing the above description. The scope of the various embodiments of the disclosure includes other applications in which the above structures and methods are used. Therefore, the scope of various embodiments of the disclosure should be determined with reference to the appended claims, along with the full range of equivalents to which such claims are entitled.

In the foregoing Detailed Description, various features are grouped together in a single exemplary embodiment for the purpose of streamlining the disclosure. This method of disclosure is not to be interpreted as reflecting an intention that the embodiments of the disclosure necessitate more features than are expressly recited in each claim. Rather, as the following claims reflect, inventive subject matter lies in less than all features of a single disclosed exemplary embodiment. Thus, the following claims are hereby incorporated into the Detailed Description, with each claim standing on its own as a separate embodiment.

What is claimed:

1. A semiconductor device, comprising:
   a drain electrode;
   a source electrode;
   a channel contacting the drain electrode and the source electrode, wherein the channel includes a metal oxide having one or more compounds of formula $A_xB_xC_xD_xO_x$ wherein A is In, B is Ga, C is Zn, D is Cd, O is atomic oxygen, and wherein each x is independently a non-zero integer;
   a gate electrode; and
   a gate dielectric positioned between the gate electrode and the channel.

2. The semiconductor device of claim 1, wherein the channel includes one of an amorphous form, a single-phase crystalline form, and a mixed-phase crystalline form.

3. The semiconductor device of claim 1, wherein the one or more compounds of the formula $A_xB_xC_xD_xO_x$ includes an atomic composition of ratio A:B:C:D, wherein A, B, C, and D are each in a range of about 0.017 to about 0.95.

4. The semiconductor device of claim 1, wherein the metal oxide includes one or more metal oxides including indium, gallium, zinc, and cadmium.

5. A semiconductor device, comprising:
   a drain electrode;
   a source electrode;
   a channel to electrically couple the drain electrode and the source electrode, wherein the channel includes an indium-gallium-zinc metal oxide formed from a precursor composition that includes indium, gallium, and zinc oxides, wherein the formed indium-gallium-zinc metal oxide is in an amorphous form; and
   a gate electrode separated from the channel by a gate dielectric.

6. The semiconductor device of claim 5, wherein the source, drain, and gate electrodes include a substantially transparent material.

7. The semiconductor device of claim 5, wherein the channel is deposited with an ink-jet deposition technique.

8. The semiconductor device of claim 5, including a substrate or substrate assembly upon which the semiconductor device is formed.

* * * * *

UNITED STATES PATENT AND TRADEMARK OFFICE
CERTIFICATE OF CORRECTION

PATENT NO. : 8,203,144 B2
APPLICATION NO. : 12/779348
DATED : June 19, 2012
INVENTOR(S) : Hoffman et al.

Page 1 of 1

It is certified that error appears in the above-identified patent and that said Letters Patent is hereby corrected as shown below:

On the Title page, in Item [63], Under "Related U.S. Application Data", in column 1, line 2, delete "7,732,251." and insert -- 7,732,251, which is a division of application No. 10/799,811, filed Mar. 12, 2004, now Pat. No. 7,297,977. --, therefor.

In the Specifications
Column 1, line 8-10, delete "7,732,251." and insert -- 7,732,251, which is a division of application No. 10/799,811, filed Mar. 12, 2004, now Pat. No. 7,297,977. --, therefor.

Signed and Sealed this
Twenty-fifth Day of March, 2014

Michelle K. Lee
*Deputy Director of the United States Patent and Trademark Office*